(12) United States Patent
Hasegawa

(10) Patent No.: US 6,291,834 B1
(45) Date of Patent: Sep. 18, 2001

(54) SEMICONDUCTOR DEVICE AND TESTING METHOD THEREFOR

(75) Inventor: Jun Hasegawa, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,590

(22) Filed: Mar. 10, 2000

(30) Foreign Application Priority Data

Mar. 15, 1999 (JP) .................................................. 11-068071

(51) Int. Cl.[7] .......................... H01L 23/58; H01L 29/06; H01L 31/0352
(52) U.S. Cl. .............................................. 257/48; 257/653
(58) Field of Search ............................... 257/48, 653, 654

(56) References Cited

U.S. PATENT DOCUMENTS 5,136,348 * 8/1992 Tsuzuki et al. .

OTHER PUBLICATIONS

K. V. Ravi, Imperfections and Impurities in Semiconductor Silicon, A Wiley–Interscience Publication (1981), pp. 232–237; 256–259.

Mukul Saran et al., Elimination of Bond–Pad Damage Through Structural Reinforcement of Intermetal. Dielectrics:, Proceedings of International Reliability Physics Symposium, (1998), pp. 225–231.

Hideki Tsuya, "Super LSI Process Control Engineering", Tokyo, (1995), pp 26–27.

* cited by examiner

Primary Examiner—Ngân V. Ngô
(74) Attorney, Agent, or Firm—Foley & Lardner

(57) ABSTRACT

A semiconductor device has a planar PN junction formed in a semiconductor substrate immediately below bonding pads subjected to mechanical stress. The P- and N-type semiconductor regions that form the PN junction have their respective width and impurity concentration set so that they are completely depleted when a given reverse voltage lower than an inherent breakdown voltage is applied across the PN junction. The PN junction is formed such that the P- and N-type semiconductor regions are each patterned into the shape of a comb and the fingers of one comb-shaped region are interleaved with those of the other comb-shaped region. Paired testing pads are provided which are electrically connected to the P- and N-type semiconductor regions of the PN junction. Application of a reverse voltage across the PN junction through the paired testing pads allows internal damage to the substrate due to mechanical stress to be detected with accuracy as a leakage current resulting from a soft breakdown of the PN junction.

20 Claims, 5 Drawing Sheets

SEMICONDUCTOR DEVICE AND TESTING METHOD THEREFOR

CROSS-REFERENCE TO RELATED APPLICATION

This application is based upon and claims the benefit of priority from the prior Japanese Patent Application No. 11-068071, filed Mar. 15, 1999, the entire contents of which are incorporated herein by reference.

BACKGROUND OF THE INVENTION

The present invention relates to a semiconductor device and a testing method therefor. More specifically, the present invention relates to the structure of portion of a semiconductor substrate that is subject to stress and a testing method for detecting damage to that portion. The present invention is adapted to detect damage that occurs within the substrate of a semiconductor chip which is subject to mechanical stress when it is packaged into a casing.

In recent years, as integrated circuits advance in miniaturization of chip design rules and functionality, the margin of manufacture generally tends to decline. In particular, the periphery of bonding pads is directly subjected to mechanical shocks by the bonder during the bonding step after a semiconductor chip is placed in a casing. Depending on the material and structure of the semiconductor chip, cracks may be induced in the chip immediately below the bonding pads.

FIG. 1 is a fragmentary plan view illustrating an arrangement of bonding pads of a conventional LSI chip and FIG. 2 is a sectional view illustrating the occurrence of a crack immediately below a pad.

In FIG. 1, 81 denotes an internal circuit area of the LSI chip, 82 a peripheral area (input/output area) of the chip, and 83 an area where the pads are arranged.

In FIG. 2, 90 denotes a semiconductor substrate, 92 a field oxide film, 92 an interlayer insulating film, 93 a pad formed on the interlayer insulating film, 94 a passivation film, and 95 a crack.

The operating speed of MOS devices shows a tendency to have reached the top because of an increase in parasitic resistance due to shallow source-drain junctions and velocity saturation of carriers. As a countermeasure, an attempt has been made to use low-resistivity Cu interconnections and low-dielectric-constant interlayer insulating films.

It has been reported that, when a low-dielectric-constant interlayer insulating film is used, a failure of Cu interconnections peeling off the insulating film occurs immediately below the pads (Mukul Saran et al., "Elimination of Bond-Pad Damage Through Structural Reinforcement of Intermetal Dielectrics", Proceedings of International Reliability Physics Symposium, 1998, pp. 225 to 231). This failure is a serious problem for the evolution of LSIs.

Heretofore, in order to detect damage that occurred in the substrate below pads, it has been required to disassemble the semiconductor chip and etch the substrate using an etchant such as KOH. With this method, however, a troublesome defect detection processing is needed and it is impossible to detect accurately substrate damage over the whole region of the chip.

BRIEF SUMMARY OF THE INVENTION

It is an object of the present invention to provide a semiconductor device which permits damage to that region of a semiconductor substrate which is subjected to mechanical stress to be detected accurately and easily and a testing method therefor.

According to a first aspect of the present invention there is provided a semiconductor device comprising: a semiconductor substrate having an area where a circuit is formed; and a region of a PN junction formed in the circuit-formed area of the semiconductor substrate so that a P-type semiconductor region and an N-type semiconductor region meet vertically with respect to a surface of the semiconductor substrate, a given reverse bias voltage being applied across the PN junction to test the PN junction region for defects.

The PN junction is preferably formed such that each of the P-type semiconductor region and the N-type semiconductor region is formed in a shape of a comb and fingers of the comb-shaped P-type semiconductor region are interleaved with those of the comb-shaped N-type semiconductor region.

Each of the P-type semiconductor region and the N-type semiconductor region has a finger width and impurity concentration thereof preferably set so that each portion of the semiconductor substrate that corresponds to a respective one of the fingers of the P-type and the N-type semiconductor region becomes completely depleted when the given reverse bias voltage is applied across the PN junction.

The PN junction region is preferably formed in a form of a strip along a substantial interface direction of the P-type and the N-type semiconductor region.

The semiconductor device preferably further comprises a plurality of bonding pads and the PN junction region in the strip form is preferably located below the plurality of bonding pads.

The semiconductor device preferably further comprises, at one end of the PN junction region in the strip form, a first testing pad connected to the P-type semiconductor region and a second testing pad connected to the N-type semiconductor region.

The fist and second testing pads are preferably provided in a pad area where the plurality of bonding pads are placed.

The PN junction region in the strip form is preferably formed on a periphery of the circuit-formed area of the semiconductor substrate.

According to a second aspect of the present invention there is provided a semiconductor device comprising: a semiconductor substrate; a plurality of bonding pads formed on the semiconductor substrate; and a plurality of PN junction regions each of which is formed in the semiconductor substrate immediately below at least a central portion of a respective one of the plurality of bonding pads, each of the PN junction regions being formed such that a P-type semiconductor region and an N-type semiconductor region meet vertically with respect to a surface of the semiconductor substrate and the plurality of PN junction regions being electrically connected in parallel.

The P-type semiconductor region and the N-type semiconductor region in an arbitrary one of the plurality of PN junction regions are preferably formed continuous with the P-type semiconductor region and the N-type semiconductor region, respectively, in an adjacent one of the arbitrary one of the plurality of PN junction regions.

A reverse voltage smaller in magnitude than an inherent breakdown voltage of a PN junction is applied across the PN junction of each of the plurality of PN junction regions.

Each of the P-type semiconductor region and the N-type semiconductor region has a size and impurity concentration thereof preferably set so as to be completely depleted when a given reverse bias voltage smaller in magnitude than an inherent breakdown voltage of a PN junction formed thereby is applied therebetween.

The PN junction region is preferably formed such that each of the P-type semiconductor region and the N-type semiconductor region is formed in a shape of a comb and fingers of one of the comb-shaped P- and N-type semiconductor regions are interleaved with those of the other.

The semiconductor device preferably further comprises electrode pads electrically connected to the P-type semiconductor region and the N-type semiconductor region, respectively, through which a reverse voltage is applied between the P-type semiconductor region and the N-type semiconductor region.

The electrode pads are preferably provided in a pad area where the plurality of bonding pads are placed.

The semiconductor device preferably further comprises an in-chip test circuit which applies a given reverse voltage between the P-type semiconductor region and the N-type semiconductor region.

As an alternative, a given voltage may be externally applied across the PN junction through electrode pads.

According to a third aspect of the present invention there is provided a semiconductor device testing method comprising the steps of: preparing a semiconductor chip having a PN junction formed in a semiconductor substrate immediately below at least a central portion of each of bonding pads, the PN junction being formed of a P-type semiconductor region and an N-type semiconductor region that meet vertically with respect to a surface of the substrate; applying a given reverse voltage across the PN junction; and detecting a leakage current resulting from a soft breakdown in a reverse current versus reverse voltage characteristic of the PN junction.

The step of preparing the semiconductor chip preferably includes a step of bonding wires to the bonding pads.

The step of applying the reverse voltage across the PN junction includes a step of externally applying the given reverse voltage across the PN junction through terminals connected to the P-type semiconductor region and the N-type semiconductor region of the PN junction.

The step of applying the reverse voltage across the PN junction may include a step of applying the given reverse voltage across the PN junction from a power supply built in the semiconductor chip.

The semiconductor device of the present invention is formed with a planar PN junction in portions of substrate which are subjected to stress during packaging of a semiconductor chip, particularly in portions of the substrate which are located immediately below the bonding pads subjected to mechanical stress.

Further, the P-type semiconductor region and the N-type semiconductor region have their respective size and impurity concentration set so that, when a given reverse bias voltage is applied across the PN junction, they become completely depleted before the inherent breakdown occurs.

The PN junction region is formed such that each of the P-type semiconductor region and the N-type semiconductor region is patterned into the shape of a comb and the fingers of one of the comb-shaped P- and N-type semiconductor regions are interleaved with those of the other, thus facilitating pattern design.

The application of a reverse voltage across the PN junction through the electrode pads electrically connected to the P- and N-type semiconductor regions allows damage to the substrate that occurred during packaging to be detected as a leakage current resulting from a soft breakdown in the I–V characteristic of the PN junction with extremely high accuracy in picoampere units.

The electrode pads are provided in space in the pad area, requiring no increase in the area of the chip.

The PN junction are provided two-dimensionally in the substrate, allowing damage to the substrate to be detected over a wide area of the substrate.

Because the P- and N-type semiconductor regions are each formed continuously in portions of the substrate which are subjected to mechanical stress, for example, immediately below the bonding pads, the PN junctions below the pads are electrically connected in parallel, allowing damage to be detected even if it has occurred in a single place in the substrate.

The provision of external terminals connected to the bias voltage supply electrode pads allows a damage test of the semiconductor device to be made from outside with ease. For example, damage that occurred at the time of bonding can be detected by a sampling test immediately after the bonding step.

The provision of an in-chip test circuit arranged to apply a reverse voltage across the PN junction allows a damage test to be made with ease in a chip testing step without disassembling the chip and using external terminals.

The semiconductor device testing method of the present invention is characterized by applying a reverse voltage across the PN junction through the external terminals connected to the reverse bias voltage supply electrode pads after the manufacture of the semiconductor device and detecting the presence or absence of a soft breakdown in the reverse current versus reverse voltage characteristic of the PN junction on the basis of a leakage current in the PN junction resulting from damage to the substrate.

The testing method is effectively carried out particularly after wires are bonded to the bonding pads on the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Before describing the preferred embodiments of the present invention, the theoretical background of the invention will be described.

It has been described in "Super LSI Process Control Engineering" by Hideki Tsuya, Maruzen, Tokyo, pp. 26–27, and "Imperfections and Impurities in Semiconductor Silicon" by K. V. Ravi, A Wiley-Intersience Publication, 1981, pp. 235 and 258 that heavy metals and lattice defects present in a depletion layer formed when an electric field is applied across a PN junction act as centers of generation and recombination of carriers and a soft breakdown takes place in the PN junction.

The present invention applies the theory to the detection of damage within a semiconductor substrate. That is, the present invention detects damage due to lattice defects developed in regions of a semiconductor substrate which are subjected to mechanical stress as a soft breakdown of a PN junction.

The typical regions within the substrate of a semiconductor chip which are subjected to stress are regions to which mechanical stress is directly applied during the packaging of the chip, particularly regions immediately below bonding pads to which wires are to be bonded or on which bumps are formed. Within the substrate immediately below the bonding pads a planar PN junction is formed of a P-type semiconductor region and an N-type semiconductor region (i.e., both the regions meet vertically with respect the surface of the substrate).

Where damage (for example, crystal dislocation) is caused in the PN junction region within the substrate immediately below the bonding pads by the bonding step during the packaging of a semiconductor chip, the dislocation deforms the crystalline structure, introducing energy levels in the band gap.

Figure 1:
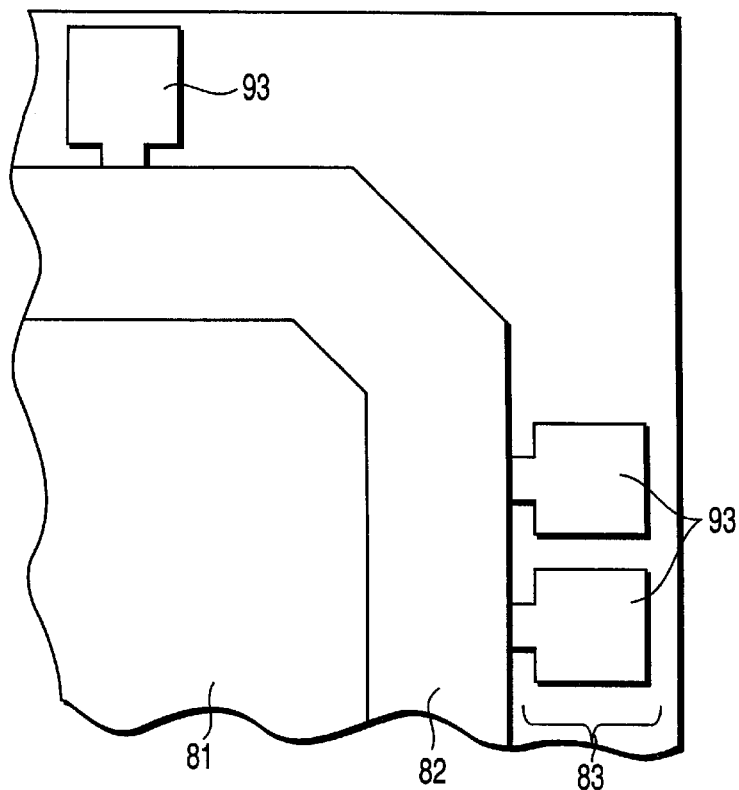
FIG. 1 is fragmentary plan view of a conventional LSI chip illustrating an arrangement of bonding pads.
Figure 2:
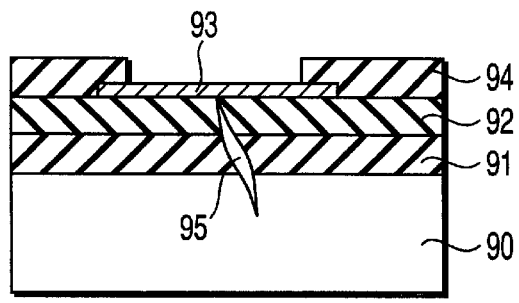
FIG. 2 is a sectional view of the LSI chip of FIG. 1 when a crack has occurred in a portion of the substrate immediately below a bonding pad.
Figure 3:
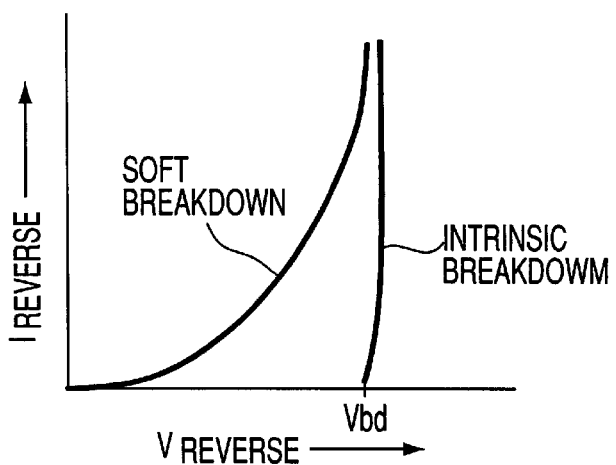
FIG. 3 shows a reverse current versus reverse voltage characteristic of a PN junction for use in explanation of the principles of the present invention.

If these levels are present in the depletion layer, then they act as a carrier recombination center. As a result, a recombination current becomes observed in the reverse characteristic of the PN junction and the application of a reverse voltage across the PN junction leads to a leakage current. Particularly when the damage becomes so serious as to affect the device characteristic and the leakage current increases, the PN junction undergoes a soft breakdown as shown in the reverse voltage Vreverse versus reverse current Ireverse characteristic of FIG. 3 (see the aforementioned books). In FIG. 3, Vbd is the inherent breakdown voltage of the PN junction.

Even in the presence of damage outside the depletion layer, increasing the applied voltage causes the depletion layer to spread and consequently allows the presence of damage to be detected electrically. Therefore, the utilization of the aforementioned principle allows damage to the substrate to be detected with high accuracy.

However, when the reverse voltage is increased to some degree, the inherent breakdown of the PN junction takes place; thus, defects (damage) present in regions away from the depletion layer cannot be detected through the use of a single PN junction structure.

If a PN-junction pattern has been formed in accordance with predetermined design criteria, then the depletion layer will spread from each of P-type and N-type regions when a reverse voltage is applied across the PN junction, thus allowing, in principle, the presence of damage in all the regions where the PN-junction pattern is formed to be detected.

Hereinafter, the embodiments of the present invention will be described with reference to the accompanying drawings.

First Embodiment

Figure 4:
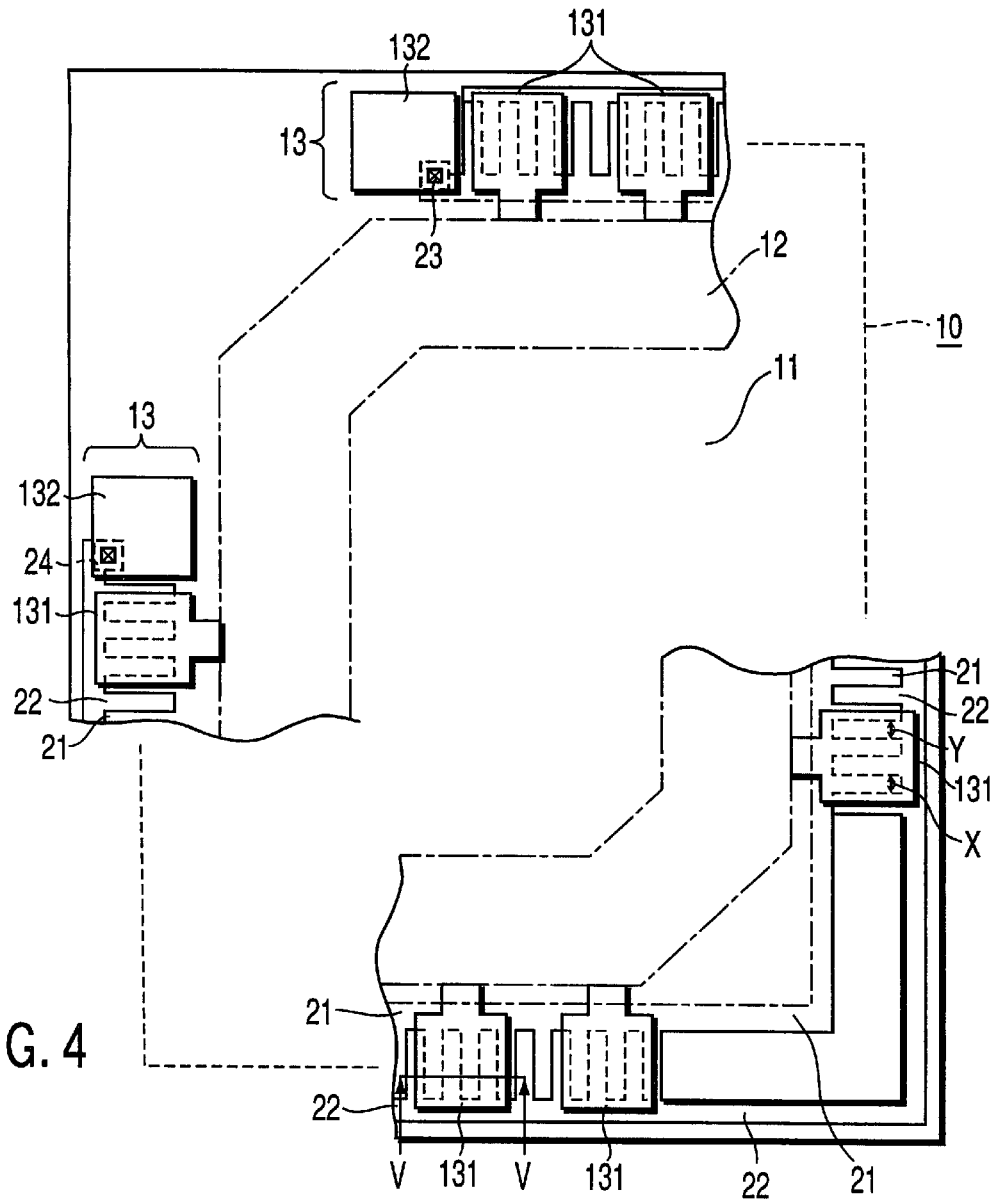
FIG. 4 is a schematic plan view of part of a CMOS logic LSI chip according to a first embodiment of the present invention.

FIG. 4 is a schematic plan view of a CMOS logic LSI as a first embodiment of the semiconductor device of the present invention.

A logic LSI chip 10 shown in FIG. 4 is divided roughly into a central cell area 11, a peripheral input/output cell area 12, and an outermost pad area 13.

In the pad area 13, a number of bonding pads 131 and a pair of bias voltage applying (substrate damage detecting) pads 132 to be described later are formed in such an arrangement as shown in FIG. 4. In that region of a substrate 20 which is located immediately below each of the pads 131 to which mechanical stress is directly applied from outside during packaging of a chip, a PN junction consisting of a P-type semiconductor region and an N-type semiconductor region is formed to meet the surface of the substrate and extend along the substrate surface.

Figure 5:
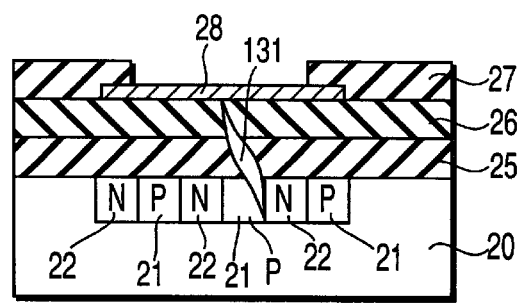
FIG. 5 is a sectional view taken along the line V—V of FIG. 4.

FIG. 5 is a sectional view of the substrate structure taken along line V—V of FIG. 4 and schematically shows the occurrence of a crack immediately below the bonding pad 131.

In FIG. 5, 20 denotes a semiconductor silicon substrate of, say, P-type conductivity. In the substrate 20 immediately below the pad is formed a PN junction consisting of a P-type region 21 and an N-type region 22 so that the junction extends two-dimensionally along the substrate surface. The reference numeral 25 denotes a field oxide film selectively formed on the top of the semiconductor substrate, 26 an interlayer insulating film, 131 a bonding pad formed on the interlayer insulating layer, 27 a passivation film, and 28 a crack.

The PN junctions immediately below the pads 131 are electrically connected in parallel. In this example, each of the P-type region 21 and the N-type region 22 below each pad is formed to be continuous with a corresponding one of the P- and N-type regions below the next adjacent pad.

In this case, as shown in FIG. 4, each of the P-type and N-type regions is formed into a comb-shaped pattern and the fingers of one region are interleaved with those of the other region.

A P+-type electrode region 23 that connects with the P-type region 21 and an N+-type electrode region 24 that connects with the N-type region 22 are formed in the substrate in the pad-formed area 13. Each of these electrode regions 23 and 24 is in contact with a corresponding one of the paired pads 132 used to apply a bias voltage across the PN junction.

The p-type region 21 and the P+-type electrode region 23 are formed simultaneously with the formation of P-wells into the device region of the semiconductor substrate immediately below the field oxide layer for CMOS isolation. Likewise, the N-type region 22 and the N+-type electrode region 24 are formed simultaneously with the formation of N-wells.

The P-type region 21 and the N-type region 22 have their respective widths X and Y and impurity concentrations set so that, when a reverse voltage is applied across the PN junction and its magnitude is increased, each region is completely depleted before the inherent breakdown occurs as shown in the Ireverse versus Vreverse characteristic of FIG. 3.

That is, the P-type and N-type regions 21 and 22 are set so that complete depletion occurs at a reverse voltage which is in the neighborhood of the reverse voltage Vbd at which the inherent breakdown occurs but lower than Vbd. This will be described with reference to FIGS. 6 and 7.

Figure 6:
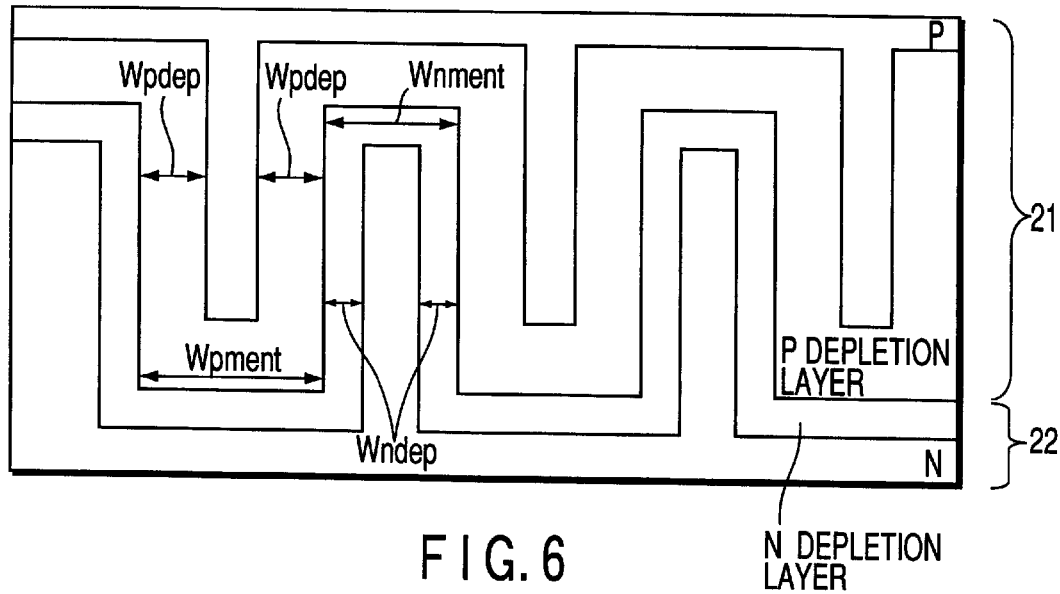
FIG. 6 is a plan view of the PN junction in FIG. 4 for use in explanation of the design criteria for comb-shaped patterns of the PN junction and illustrates the spreading of depletion layers of P-type and N-type regions when a reverse voltage is applied across the PN junction which is lower than the inherent breakdown voltage thereof.

FIG. 6 shows the width Wpmet of the P-type region 21 and the width Wpdep of its depletion layer and the width wnmet of the N-type region 22 and the width Wndep of its depletion layer when a reverse voltage Vreverse lower than the breakdown voltage Vbd of the PN junction is applied.

Figure 7:
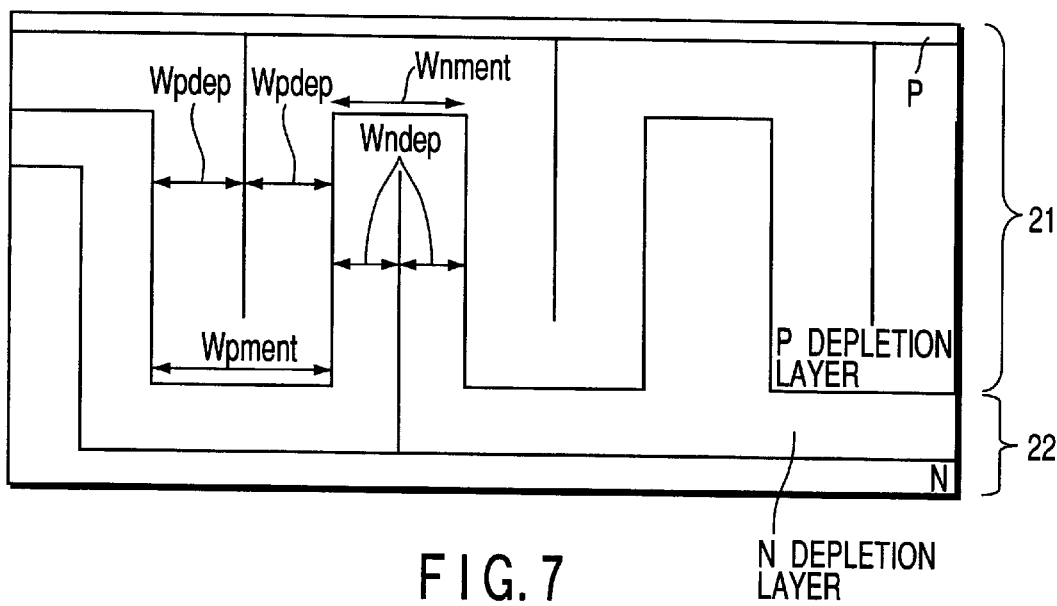
FIG. 7 is a view similar to that of FIG. 6 and illustrates the spreading of the depletion layers when a reverse voltage is applied across the PN junction which corresponds to the inherent breakdown voltage.

FIG. 7 shows the width Wpmet of the P-type region 21 and the width Wpdep of its depletion layer and the width Wnmet of the N-type region 22 and the width Wndep of its depletion layer when a reverse voltage which is a very little lower than the breakdown voltage Vbd is applied.

In FIGS. 6 and 7, if $2 \times Wpdep \geq wpmet$ and $2 \times Wndep \geq Wnmet$ are met, then the comb-shaped pattern area can be depleted completely. In the case of FIGS. 6 and 7, the impurity concentration of the P-type region 21 is set higher than that of the N-type region 22, so that Wpdep>Wndep.

With the above-described LSI structure, if damage has occurred to the substrate 20 immediately below the bonding pads 131 during the manufacturing of the LSIs, the substrate damage can be detected in the following way:

A reverse voltage is applied across the PN junction through the paired bias voltage supply terminals 132 in a sampling test after the bonding step. Thereby, a soft breakdown occurs in the PN junction, causing a leakage current to flow between the paired bias voltage supply terminals. By sensing the leakage current, the occurrence of the substrate damage can be detected.

Because the PN junction immediately below each bonding pad is electrically connected in parallel with the PN junction immediately below any other bonding pad, damage that has occurred in a substrate region located immediately below each bonding pad can be detected.

Where in the substrate immediately below the bonding pads the damage has occurred can be identified through the use of an existing technique to observe light emission from the backside of the substrate.

LSIs of the above-described structure can be manufactured using the conventional manufacturing process simply by changing masks used. That is, no additional process is required. The provision of electrodes connected with extensions of the P-type and N-type regions that form the PN junction results in little increase in the pattern area. There is also little increase in parasitic capacitance. Therefore, the LSI structure of the present invention is very versatile and applicable to all products that have bonding pads.

The P-type region 21 and the N-type region 22 do not necessarily have to be formed in the interlocking comb-shaped patterns as described above, but may be formed in any other patterns which satisfy such design criteria as described above.

Figure 8:
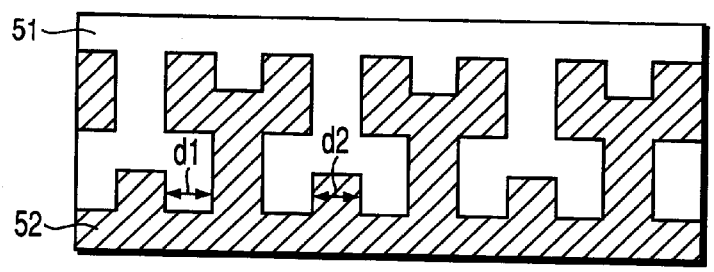
FIG. 8 shows a variation of the comb-shaped patterns of the PN junction shown in FIG. 4.

FIG. 8 shows a variation of the interlocking comb-shaped patterns of the P-type and N-type regions in the PN junction region. The PN junction region shown in FIG. 8 is formed such that tulip-like flower patterns are protruded from each of P-type and N-type regions 51 and 52 and the pattern protrusions of one region are interleaved with those of the other region. The spacing between pattern portions of the same conductivity type which are opposed to each other with the region of the other conductivity type interposed therebetween, d1, d2, is determined so as to satisfy the above-described design criterion.

In the present embodiment, there is no restriction on the relationship in size between the bonding pad and the PN junction region below it. The larger the PN junction region, the more the detection sensitivity increases. Bonding is usually performed on the central portion of each pad; thus, the PN junction below the pad needs not necessarily to be larger than the pad. Devices, such as transistors and diodes, cannot be formed in the PN junction region. For this reason, making the PN junction region larger is against reducing the chip size. In general, when the chip has room to accommodate large PN junction regions, in order to increase the detection sensitivity it is better to make the PN junction region larger than the pad.

When bumps (not shown) are formed on the pads 131, they grow on exposed areas of all the pads. In some cases, therefore, it is more effective to design the PN junction region to be the size of the pad.

Figure 9:
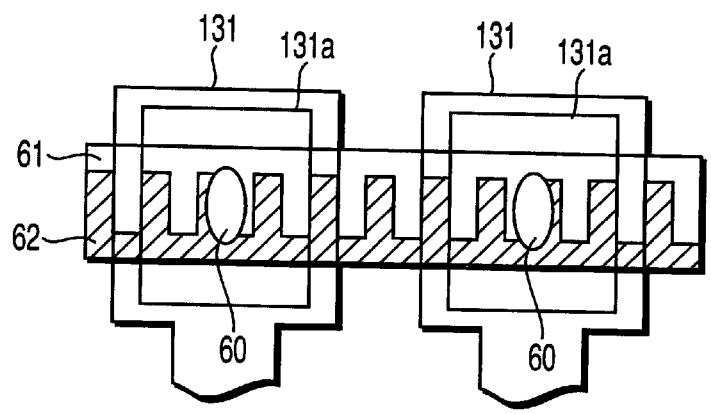
FIG. 9 is a schematic plan view of the pad area when the PN junction region below each bonding pad is set smaller than the pad.
Figure 10:
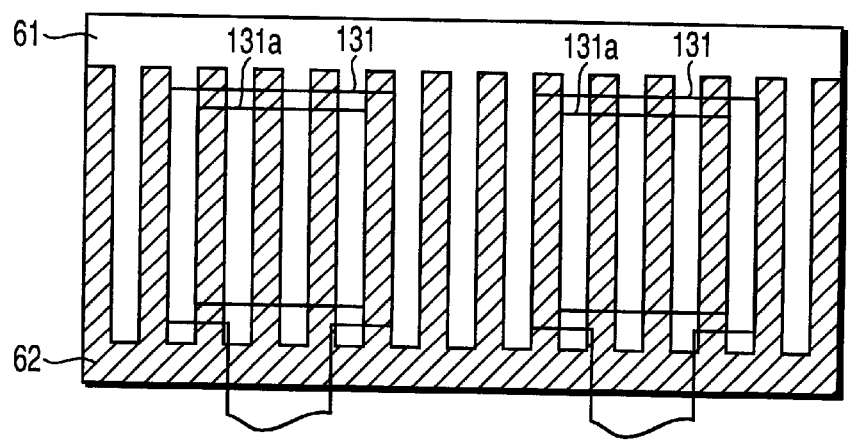
FIG. 10 is a schematic plan view of the pad area when the PN junction region below each bonding pad is set larger than the pad.

FIGS. 9 and 10 show examples of changing the size of the PN junction region of FIG. 4. FIG. 9 shows a case where the PN junction region is set smaller than the pad 131, while FIG. 10 shows a case where the PN junction region is larger than the pad.

In FIGS. 9 and 10, 62 denotes the P-type region, 62 the N-type region, 131a openings formed in an insulating layer above the pads 131 through which the pads are exposed, and 60 areas where bonding is performed on the central portions of the pads.

Second Embodiment

Next, a description is given of an application of the present invention to the detection of damage to regions of a substrate other than regions immediately below bonding pads.

With recent progress of LSIs in functionality and added value, the incorporation of a DRAM into a logic LSI has been performed. To this end, trench capacitors are sometimes formed in a semiconductor substrate. In this case, stress resulting from stacking materials of different composition on top of each other in a chip may cause damage to the substrate.

It is therefore useful to form such a PN junction region in desired portions in the substrate other than those immediately below bonding pads and detect damage (crystal dislocation) inside the chip.

Figure 11:
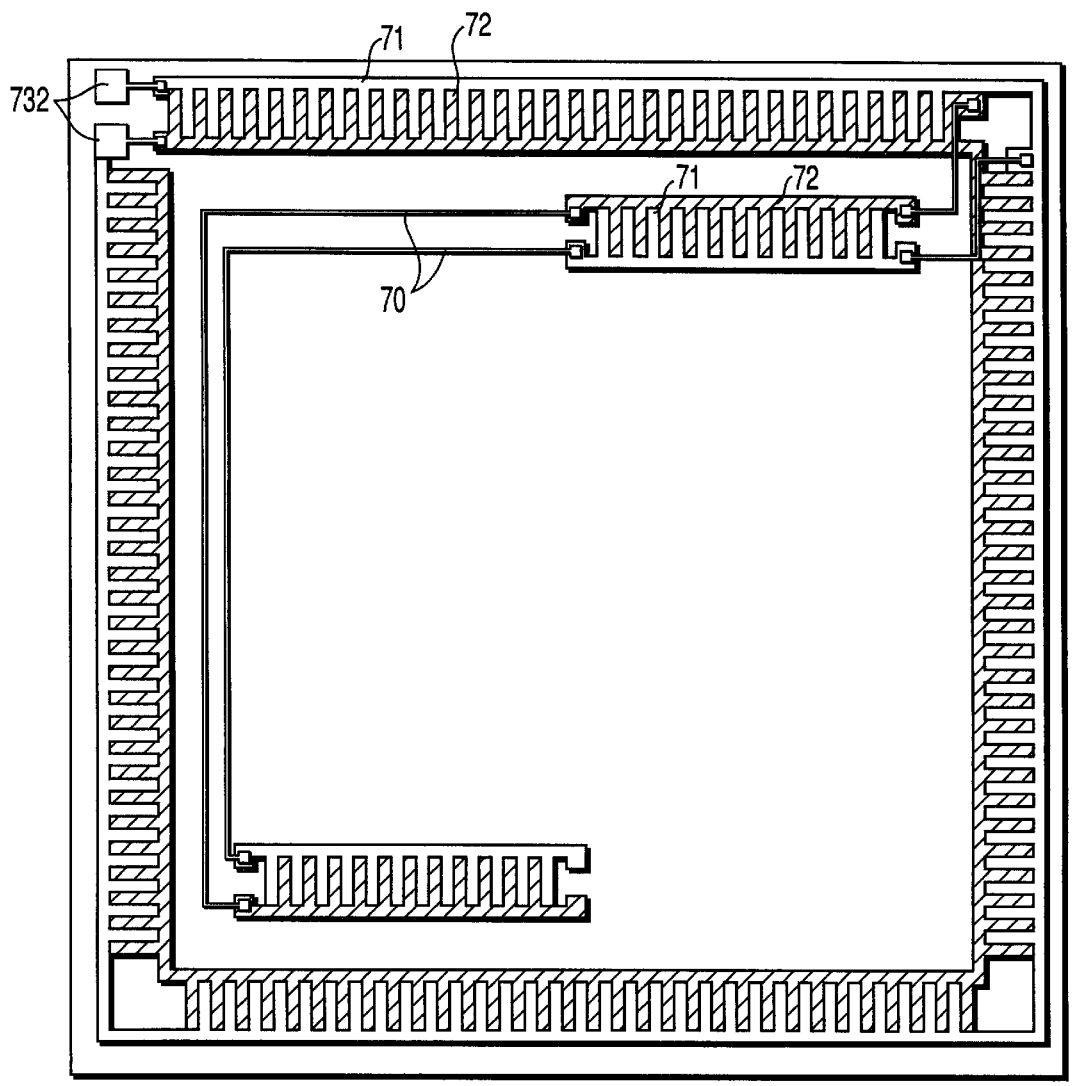
FIG. 11 is a schematic plan view of an LSI chip illustrating part of the pattern layout of an LSI chip according to a second embodiment of the present invention.

FIG. 11 is a schematic top view of an LSI according to the second embodiment of the present invention. This LSI allows the detection of substrate damage not only in regions immediately below bonding pads but in other substrate regions.

In the LSI of FIG. 11, PN junction regions where comb-shaped P-type and N-type regions 71 and 72 meet are formed in the pad area on the periphery of the chip and areas on the inside of the chip. The corresponding semiconductor regions in the PN junction regions in the areas on the inside of the chip are electrically connected by an interconnect line 70. By using multilevel interconnections, the interconnections 70 can be crossed with one above the other. It is also possible to change the positional relationship between the P-type and N-type regions 71 and 72. Further, it is possible to place the PN junction regions on the inside of the chip in desired places.

In this embodiment, a pair of detecting pads 732 provided at one corner of the chip allows information concerning damage to substrate regions immediately below the bonding pads and inside the chip to be electrically detected. In FIG. 11, the bonding pads are omitted only for the purpose of simplifying illustration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate having an area where a circuit is formed; and
   a region of a PN junction formed in the circuit-formed area of the semiconductor substrate so that a P-type semiconductor region and an N-type semiconductor region meet vertically with respect to a surface of the semiconductor substrate, a given reverse bias voltage being applied across the PN junction to test the PN junction region for defects.

2. The semiconductor device according to claim 1, wherein the PN junction is formed such that each of the P-type semiconductor region and the N-type semiconductor region is formed in a shape of a comb and fingers of the comb-shaped P-type semiconductor region are interleaved with those of the comb-shaped N-type semiconductor region.

3. The semiconductor device according to claim 2, wherein each of the P-type semiconductor region and the N-type semiconductor region has a finger width and impurity concentration thereof set so that each portion of the semiconductor substrate that corresponds to a respective one of the fingers of the P-type and the N-type semiconductor region becomes completely depleted when the given reverse bias voltage is applied across the PN junction.

4. The semiconductor device according to claim 1, wherein the PN junction region is formed in a form of a strip along a substantial interface direction of the P-type and the N-type semiconductor region.

5. The semiconductor device according to claim 4, further comprising a plurality of bonding pads, wherein the PN junction region in the strip form is located below the plurality of bonding pads.

6. The semiconductor device according to claim 5, further comprising, at one end of the PN junction region in the strip form, a first testing pad connected to the P-type semiconductor region and a second testing pad connected to the N-type semiconductor region.

7. The semiconductor device according to claim 6, wherein the first testing pad and the second testing pad are provided in a pad area where the plurality of bonding pads are placed.

8. The semiconductor device according to claim 4, wherein the PN junction region in the strip form is formed on a periphery of the circuit-formed area of the semiconductor substrate.

9. A semiconductor device comprising:
   a semiconductor substrate;
   a plurality of bonding pads formed on the semiconductor substrate; and
   a plurality of PN junction regions each of which is formed in the semiconductor substrate immediately below at least a central portion of a respective one of the plurality of bonding pads, each of the PN junction regions being formed such that a P-type semiconductor region and an N-type semiconductor region meet vertically with respect to a surface of the semiconductor substrate and the plurality of PN junction regions being electrically connected in parallel.

10. The semiconductor device according to claim 9, wherein the P-type semiconductor region and the N-type semiconductor region in an arbitrary one of the plurality of PN junction regions are formed continuous with the P-type semiconductor region and the N-type semiconductor region, respectively, in an adjacent one of the arbitrary one of the plurality of PN junction regions.

11. The semiconductor device according to claim 9, wherein a reverse voltage smaller in magnitude than an inherent breakdown voltage of a PN junction is applied across the PN junction of each of the plurality of PN junction regions.

12. The semiconductor device according to claim 9, wherein each of the P-type semiconductor region and the N-type semiconductor region has a size and impurity concentration thereof set so as to be completely depleted when a given reverse bias voltage smaller in magnitude than an inherent breakdown voltage of a PN junction formed thereby is applied therebetween.

13. The semiconductor device according to claim 9, wherein the P-type semiconductor region and the N-type semiconductor region are each formed in a shape of a comb and fingers of one of the comb-shaped P- and N-type semiconductor regions are interleaved with those of the other.

14. The semiconductor device according to claim 9, further comprising electrode pads electrically connected to the P-type semiconductor region and the N-type semiconductor region, respectively, through which a reverse voltage is applied between the P-type semiconductor region and the N-type semiconductor region.

15. The semiconductor device according to claim 14, wherein the electrode pads are provided in a pad area where the plurality of bonding pads are placed.

16. The semiconductor device according to claim 9, further comprising an in-chip test circuit which applies a given reverse voltage between the P-type semiconductor region and the N-type semiconductor region.

17. A semiconductor device testing method comprising the steps of:
   preparing a semiconductor chip having a PN junction formed in a semiconductor substrate immediately below at least a central portion of each of bonding pads, the PN junction being formed of a P-type semiconductor region and an N-type semiconductor region that meets vertically with respect to a surface of the substrate;

applying a given reverse voltage across the PN junction; and detecting a leakage current resulting from a soft breakdown in a reverse current versus reverse voltage characteristic of the PN junction.

18. The semiconductor device testing method according to claim 17, wherein the step of preparing the semiconductor chip includes a step of bonding wires to the bonding pads.

19. The semiconductor device testing method according to claim 17, wherein the step of applying the reverse voltage across the PN junction includes a step of externally applying the given reverse voltage across the PN junction through terminals connected to the P-type semiconductor region and the N-type semiconductor region of the PN junction.

20. The semiconductor device testing method according to claim 17, wherein the step of applying the reverse voltage across the PN junction includes a step of applying the given reverse voltage across the PN junction from a power supply built in the semiconductor chip.

* * * * *